Jan. 30, 1962 R. E. MORGAN 3,019,355
MAGNETIC SILICON CONTROLLED RECTIFIER POWER AMPLIFIER
Filed Aug. 12, 1959 3 Sheets-Sheet 1
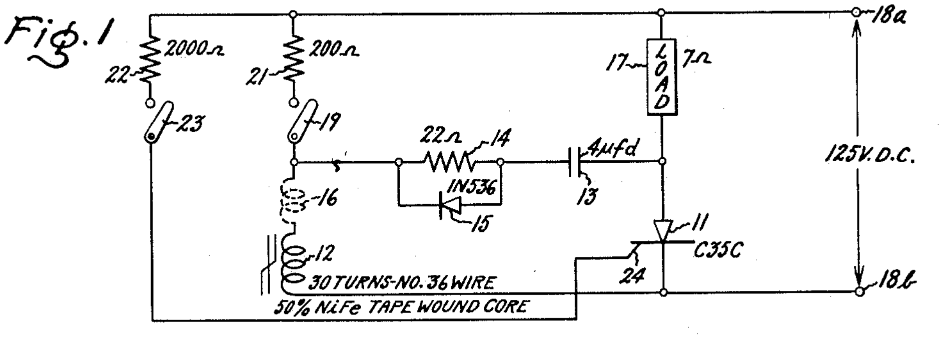
Fig. 2
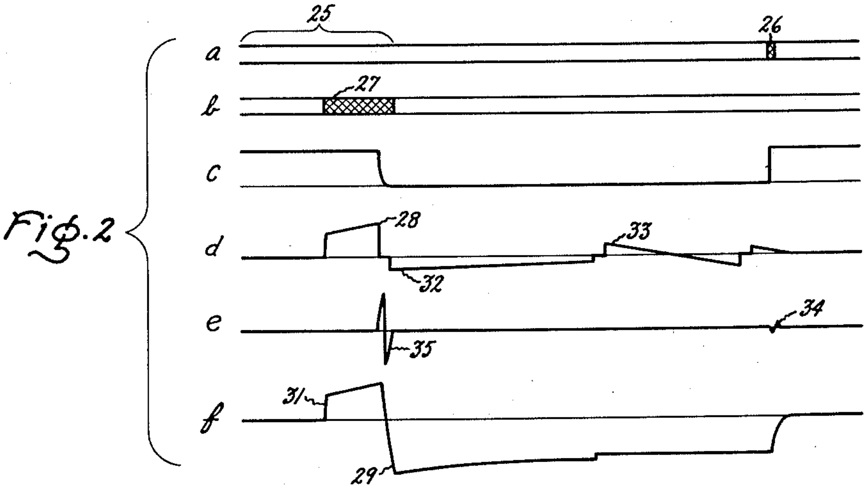
Fig. 3
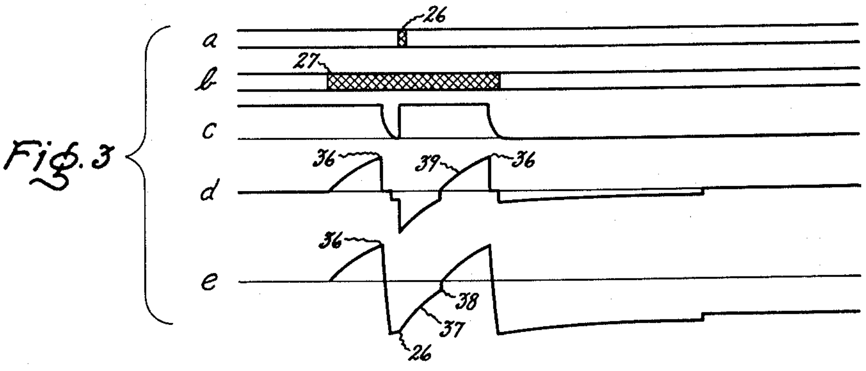
Inventor
Raymond E. Morgan
by Charles W Helzer
His Attorney Inventor
Raymond E. Morgan
by Charles W. Helzer
His Attorney

MAGNETIC SILICON CONTROLLED RECTIFIER POWER AMPLIFIER

Filed Aug. 12, 1959 3 Sheets-Sheet 3

Inventor
Raymond E. Morgan
by Charles W. Helzer
His Attorney

United States Patent Office 3,019,355

Patented Jan. 30, 1962

3,019,355
MAGNETIC SILICON CONTROLLED RECTIFIER POWER AMPLIFIER

Raymond Evan Morgan, Schenectady, N.Y., assignor to General Electric Company, a corporation of New York Filed Aug. 12, 1959, Ser. No. 833,292
19 Claims. (Cl. 307—88.5)

The present invention relates to a new and improved power amplifier circuit employing a solid state silicon controlled rectifier which operates in conjunction with a saturable core transformer as a proportionally controlled power amplifier.

The wide spread use of electrical equipment such as controlled motors, generators, electric furnaces and the like throughout industry have resulted in a large demand for highly efficient, high gain, fast responding power amplifiers. Currently used class A loss type power amplifiers have not proved satisfactory for many uses due to their poor efficiency caused by large power losses, heat dissipation problems, their large size and cost. Consequently, an urgent need exists for a high efficiency power amplifier to replace the low efficiency units presently being used throughout industry.

It is, therefore, a primary object of the present invention to provide new and improved proportionally controlled power amplifiers which have high gain, fast response, and are highly efficient in operation.

Another object of the invention is to provide a new and improved commutating network for use in conjunction with a silicon controlled rectifier in proportionally controlled amplifier circuits and the like for causing the silicon controlled rectifier to turn off after it has been rendered conductive. This commutating circuit is exceptionally flexible in that it develops a quenching potential having a magnitude dependent upon the magnitude of the load current.

A still further object of the invention is to provide new and improved gating circuit arrangements for use with silicon controlled rectifiers to control the point at which the rectifiers are rendered conductive by an applied gating control signal.

In practicing the invention, a grid controlled unidirectional conducting device is provided which has a cathode-anode and gating electrode, and is of the type wherein conduction through the device is initiated by the gating electrode, but thereafter the gating electrode loses control over conduction through the device. In the present invention, means are supplied for applying a gating control signal to the gating electrode of the unidirectional conducting device to render it conductive. To turn the device off, a saturable core reactor is provided which is operatively coupled to the unidirectional conducting device and is in circuit relationship with a charging device, such as a charging capacitor, for applying a quenching potential to the unidirectional conducting device upon the saturable reactor reaching a saturated condition. This quenching potential then terminates conduction through the unidirectional conducting device. In one embodiment of a proportionally controlled power amplifier constructed in accordance with the present invention, the gating control signal is applied to the unidirectional conducting device through a gating circuit employing a saturable core transformer having a primary winding and a split secondary winding. In this gating circuit arrangement, the primary winding of the saturable transformer is connected in the anode-cathode circuit of the unidirectional conducting device, and a pair of impedances are connected in series circuit relationship with each of the winding halves of the split secondary winding, which, in turn, are connected across the unidirectional conducting device and to the gating electrode thereof. In a second embodiment of a proportionally controlled amplifier constructed in accordance with the invention, a gating circuit is provided which utilizes a unijunction transistor to develop the gating control signal applied to the gating electrode of the unidirectional conducting device.

Other objects, features, and many of the attendant advantages of this invention will be appreciated more readily as the same becomes better understood by reference to the following detailed description, when considered in connection with the accompanying drawings, wherein like parts in each of the several figures are identified by the same reference character, and wherein:

FIGURE 1 is a schematic circuit diagram of a hypothetical switch controlled blocking oscillator circuit employing a saturable reactor and silicon controlled rectifier, and illustrates the principles of operation of the new and improved proportionally controlled power amplifiers constructed in accordance with the invention;

FIGURE 2 is a series of waveshape and timing diagrams illustrating the voltage-time characteristics of a form of the circuit shown in FIGURE 1;

FIGURE 3 is a series of voltage waveshapes and switching time diagrams illustrating the operation of the circuit of FIGURE 1 upon the addition of a smoothing circuit arrangement;

Figure 4:
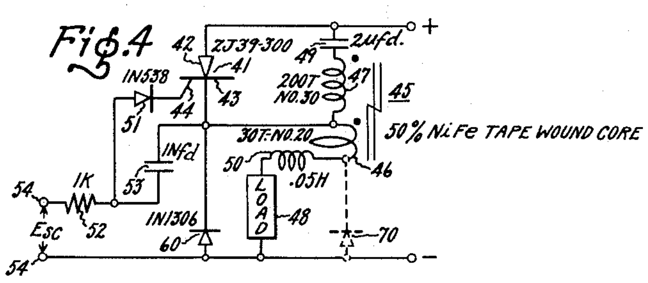
FIGURE 4 is a schematic circuit diagram of one preferred form of a proportionally controlled amplifier circuit constructed in accordance with the invention.

The simplified circuit arrangement shown in FIGURE 1 of the drawings has been disclosed to facilitate explanation of the operation of the new and improved proportionally controlled power amplifiers constructed in accordance with the invention. The simplified circuit of FIGURE 1 includes a silicon controlled rectifier 11 which comprises a solid state transistor-like device having anode and cathode electrodes and a gating electrode. The gating electrode of the device controls conduction through the device in that it initiates conduction but thereafter loses control over electric conduction through the anode and cathode of the device. As this characteristic is similar to that of the gaseous thyratron, the silicon controlled rectifier might be said to be the solid state equivalent of a thyratron grid controlled gas discharge tube. For a more detailed description of the silicon controlled rectifier, reference is made to page 103 of the "Transistor Manual," third edition, published by the General Electric Company, Semiconductor Products, 1224 West Genesee Street, Syracuse, New York, copyright 1958. Because the gating electrode loses control over conduction through the silicon controlled rectifier 11 after conduction has been initiated, in order to terminate conduction it is necessary to reduce the relative anode-cathode potential of the device to cut off conduction through the device similarly to the grid controlled gaseous thyratron tube. For this purpose, a novel commutating circuit arrangement for use in silicon controlled power amplifier circuits is described, hereinafter, and comprises an essential part of the present invention. This novel commutating circuit includes as a primary part thereof a saturable core reactor winding 12 formed by approximately 30 turns of No. 36 wire wound around a 50% Ni—Fe core. The winding 12 is connected in series circuit relationship with a charging device comprised by a charging capacitor 13. As will be described more fully hereinafter, preferred embodiments of the circuit will include a smoothing resistor 14 connected in series circuit relationship with the charging capacitor 13 and the saturable reactor 12, and a by-pass diode rectifier 15 is connected in parallel across the smoothing resistor 14. Also, for convenience in the following explanation, the self-inductance of the saturable reactor 12 in its saturated condition is indicated by the dotted line inductor 16.

To further comprise the power amplifier, the silicon controlled rectifier 11 is connected through a suitable load 17, which may be resistive, capacitive or inductive in nature, across a pair of input terminals indicated at 18 which, in turn, are connected to a stable source of direct current voltage. The charging capacitor 13 has one of its plates connected to the anode electrode of the silicon controlled rectifier 11 and the remaining plate thereof is connected to the smoothing resistor 14. The junction of the smoothing resistor 14 and the saturable core reactor 12 is connected through a selector switch 19 and voltage dropping resistor 21 to one terminal 18*a* of the source of supply voltage, and the remaining terminal of the saturable reactor 12 is connected to the remaining terminal 18*b* of the source of supply voltage. The terminal 18*a* of the source of supply voltage is also connected through a voltage dropping resistor 22 and selector switch 23 to the gating electrode 24 of the silicon controlled rectifier 11.

In the simplified circuit arrangement of FIGURE 1, should the switch 23 be closed temporarily, the silicon controlled rectifier 11 will be rendered conductive. Thereafter, the switch may be immediately reopened due to the fact that the gating electrode 24 will no longer exercise an influence conduction through the silicon controlled rectifier device 11. With the circuit constructed as above, the load current through the load 17 will have the waveshape illustrated in FIGURE 2*c* of the drawings. The timing diagram of FIGURE 2*a* illustrates the time at which the switch 23 is closed and then immediately reopened. It is assumed that a previous similar starting operation has occurred prior to the portion of the timing diagram 2*a* shown at point 25, and that the silicon controlled rectifier device 11 is conducting over this portion of the timing diagram. The switch 23 will not thereafter be again closed until the time indicated at 26 in FIGURE 2*a*. At the time indicated at 27 in FIGURE 2*b* of the drawings, the switch 19 is closed. Upon the closure of the switch 19, the charging capacitor 13 will immediately start to charge towards some positive value intermediate the full value of the potential across the terminals 18*a* and 18*b*.

Since in its conducting condition the silicon controlled rectifier 11 exhibits substantially zero resistance in the forward direction, one plate of the charging capacitor 13 is effectively at the potential of the terminal 18*b*, which shall be assumed to be the reference potential. The potential appearing across charging capacitor 13 is illustrated in the voltage waveshape of FIGURE 2*f* of the drawings. This voltage waveshape is similar to the waveshape of the voltage appearing across the unsaturated reactor 12 as shown in FIGURE 2*d* of the drawings, which is essentially a square wave. The charging current through the saturable reactor 12 will continue until the potential across the reactor reaches the point 28, which point coincides with the positive saturation condition of the saturable core of reactor 12. Upon reaching this condition, the saturable reactor will exhibit substantially zero impedance to the charge appearing across the charging capacitor 13. Ignoring temporarily the effect of the resistor 14 and diode 15, the resultant effect is to directly connect one terminal of capacitor 13 directly to the reference potential point 18*b*, thereby immediately reversing the polarity of the potential applied by the capacitor across silicon controlled rectifier 11 so that the positive potential indicated at the point 28 in FIGURE 2*f* is applied to the cathode electrode of the silicon controlled rectifier 11. This reverse polarity potential will thereafter cause the silicon controlled rectifier to cease conducting, thereby returning it to its blocking condition and conditioning it for the next cycle of operation to be commenced upon the closure of the switch 23 at the point 26 in the timing diagram of FIGURE 2*a*.

While the simplified circuit arrangement of FIGURE 1 without the smoothing resistor 14 and diode rectifier 15 operates effectively to turn off the silicon controlled rectifier 11 after it has been rendered conductive, the circuit thus comprised does exhibit certain undesirable characteristics. To be particular, from an examination of the voltage appearing across the charging capacitor 13 shown in FIGURE 2*f* of the drawings, it can be appreciated that the relatively steep wave front portion shown at 31 causes a surge of charging current which can be injurious to the dielectric of the charging capacitor 13 after a given number of cycles of operation. Further, after the charging capacitor 13 discharges, the self-inductance of the saturated reactor indicated at 60 will store a certain amount of energy discharged by the capacitor, and this stored energy will thereafter charge the charging capacitor 13 negatively as indicated at point 32 in the voltage waveform of FIGURE 2*d*. Thereafter, as the capacitor 13 proceeds to discharge the negative charge, the saturable reactor 12 will become unsaturated and will greatly retard the discharge of the capacitor 13 as is illustrated in FIGURE 2*d*. This feature is extremely useful in that it tends to reset the flux of the reactor towards negative saturation, and prepares the circuit for the next turn off operation. However, should the timing of the gating pulses be such that the reactor is reset to negative saturation prior to the selector switch 23 being closed, the charging capacitor 13 will discharge its remaining energy into the saturated inductance indicated at 16, and the saturated inductance 16 will thereafter proceed to charge the charging capacitor 13 in a positive direction, thereby creating a disturbing oscillation as is illustrated at 33. A similar disturbing oscillation causing large undesirable peaks of current in capacitor 13 is indicated at 34 in FIGURE 2*e* of the drawings and occurs when the circuit is switched on. Because these disturbing oscillations can interfere with the "turning on" and "turning off" operation of the silicon controlled rectifier, it is desirable that they be minimized. FIGURE 2*e* of the drawings indicates the waveform of potentials appearing across the saturated reactor winding depicted by the winding 16. From an examination of this waveform, it can be seen that at the point 35 in the turning off operation, considerable negative potential is built up across the saturated reactor 16 which is available to recharge the charging capacitor 13 negatively as previously described.

In order to overcome the difficulties discussed above, the smoothing resistor 14 is connected in series circuit relationship with the saturable reactor winding 12 and charging capacitor 13, and the diode 15 is connected across the smoothing resistor 14 in the manner shown in FIGURE 1. By this arrangement, the resistor 14 and diode rectifier 15 will permit the desired resetting operation produced by the negative polarity potential appearing across the saturated reactor winding 16. Hence, the rectifier 15 will permit the capacitor 13 to be charged negatively and will apply a negative voltage to reset the reactor winding 12. Thereafter, after the reactor 12 resets to negative saturation, the resistor 14 will limit the discharge rate of the capacitor 13 so as to forbid or prevent the oscillation indicated at 33. Similarly, the oscillations occurring at 34 in FIGURE 2*e* when turned on are, likewise, limited.

FIGURE 3 of the drawings illustrates the operation of the circuit of FIGURE 1 with the smoothing network included when the silicon controlled rectifier 11 is again turned on immediately after it has been turned off by the switch 19. The timing relation of the closing of the switches 23 and 19 are indicated in FIGURES 3*a* and 3*b* of the drawings. The current through the load resistors 17 is illustrated in FIGURE 3*c* of the drawings. By comparing the load current shown in FIGURE 3*c* to the load current shown in FIGURE 2*c*, it can be appreciated that by varying the relative times at which the two selector switches 19 and 23 are closed, a proportionally controlled load current can be derived in the output load circuit 17. Accordingly, the circuit is particularly well adapted for use as a proportionally controlled power amplifier circuit. The waveform of the potential appearing across the unsaturated reactor 12 is shown in FIGURE 3*d* of the drawings wherein it appears that at point 27, upon the selector switch 19 being closed, and assuming the silicon controlled rectifier 11 to be in a conducting state, the reactor winding 12 will start charging towards positive saturation. At point 36 the winding 12 reaches positive saturation and the reactance of the winding will become substantially zero so that in effect the polarity of the potential appearing across the charging capacitor 13 will be immediately reversed insofar as the silicon controlled rectifier 11 is concerned. This effect is illustrated in FIGURE 3*e* of the drawings, wherein it can be seen that at point 36 the potential appearing across the capacitor, and hence across the silicon controlled rectifier 11, drops immediately to a negative value approximately equal to the previous positive polarity charge built up across the capacitor. At this point, the selector switch 23 is closed so that the silicon controlled rectifier 11 is immediately thereafter rendered conductive as soon as the charge on capacitor 13 has dissipated sufficiently. Upon this occasion, the reactor 12 will be driven towards negative saturation along the line indicated at 37, and at point 38 in FIGURE 3*e* reaches negative saturation, at which point the charging capacitor 13 will be completely discharged. Thereafter, because the selector switch 19 is still closed, as indicated by the cross hatched portion of the timing diagram shown in FIGURE 3*b*, the capacitor 13 will immediately recharge positively by the charging current drawn through the saturable reactor winding 12. This charging current indicated at 39 in FIGURE 3*d* will drive the reactor winding 12 towards positive saturation where at point 36 it will again go through a cycle of operation as previously described.

By comparing the charging rate 39 in FIGURE 3*e* to the charging rate at 31 in FIGURE 2*f* of the drawings, it can be seen that the smoothing resistor 14 serves to limit the rate at which the charging capacitor 13 can be charged and, hence, can smooth out or limit the impulses of charge applied to the capacitor, thereby assuring it a longer operating life. Additionally, as previously explained, the presence of the smoothing resistor 14 in diode rectifier 15 serves to inhibit the oscillations and large undesirable peaks of current in capacitor 13 that would otherwise occur following the switching on and switching off operation thereby facilitating the switching on and off operations.

One practical form of a proportional controlled power amplifier incorporating the novel commutating circuit arrangement described above is illustrated in FIGURE 4 of the drawings. This proportionally controlled power amplifier is formed by a silicon controlled rectifier 41 having an anode 42, a cathode 43, and gating electrode 44. The anode 42 of the silicon controlled rectifier is connected directly to the positive terminal of a direct current power source. In place of the selector switches, the silicon controlled rectifier 41 is switched on and off by a saturable core transformer 45 having a primary winding 46 and a secondary winding 47 inductively coupled to the primary winding 46. The primary winding is formed from 30 turns of No. 20 insulated copper wire and the secondary winding is formed from approximately 200 turns of No. 30 insulated copper wire wound around a 50% nickel-iron tape wound core. The primary winding 46 of the saturable core transformer is connected directly to the cathode electrode 43 of the silicon controlled rectifier 41, and is connected through a load circuit 48 to the negative terminal of the direct current power source. The load circuit 48 may be resistive, capacitive, or inductive in nature, or it may be a rotating load such as a direct current motor. In the example shown, however, the load 48 is inductive in nature by reason of the inclusion of an inductance 50 connected between the load 48 and the primary winding 46. When driving an inductive load it is desirable that a booster diode rectifier 60 be connected across the load for a purpose to be discussed more fully hereinafter. If desired the booster rectifier may be connected across the load circuit at the point indicated by the dotted line rectifier 70. The secondary winding 47 has one terminal connected directly to the cathode electrode 43 of silicon controlled rectifier 41, and is connected in series circuit relationship with a charging capacitor 49 to the positive terminal of the direct current power source across the silicon controlled rectifier 41. Capacitor 49 is thus connected through an essentially zero impedance path across the silicon controlled rectifier 41 when the saturable reactor 47 reaches its saturation condition. By "essentially zero impedance" is meant a value of impedance which may be finite but which is so low when measured with respect to the potential available across the charged capacitor 49 that it does not impair the effect of this potential when it is applied across the silicon controlled rectifier in a reverse polarity sense to extinguish conduction through the silicon controlled rectifier. For example, the impedance of the winding 47 in its saturated condition and of a smoothing resistor 14 which may be employed in circuit which capacitor 49 will have some finite value, but when measured in its effect on the potential being supplied from the capacitor may be considered to comprise an essentially zero impedance. The gating electrode 44 of silicon controlled rectifier 41 is connected through a diode rectifier 51 to a resistance capacitance gating signal developing network formed by a resistor 52 and capacitor 53. A varying direct current gating control signal $E_{SC}$ is connected across the terminals 54 for supplying gating control signals to the gating electrode 44 through the medium of the resistance capacitance charging network formed by resistor 52 and capacitor 53. The values of the resistor 52 and capacitor 53 are proportioned to provide a desired periodic gating signal for a given value of $E_{SC}$. By varying the value of $E_{SC}$, the frequency of gating rectifier 41 on and off is varied thereby varying the load current delivered by the circuit proportionally. The circuit diagram of FIGURE 4 has the values of the various components of a typical circuit arrangement disclosed alongside the component, as do other of the circuit arrangements described hereinafter. It is to be understood that the values are cited as exemplary only, and that the circuits disclosed need not necessarily be constructed with the parameters or materials cited.

In operation, the gating circuit formed by resistor 52 and capacitor 53, in conjunction with the direct current power supply connected thereto across the terminals 54, will derive a periodic gating signal which is applied through the gating electrode 44 of silicon controlled rectifiier 41. This causes the silicon controlled rectifier to be sequentially fired on a periodic basis determined, of course, by the time constants of the RC network formed by resistor 52 and capacitor 53. By varying this time constant, the output power of the circuit may be varied proportionally. Upon being rendered conductive, the silicon controlled rectifier 41 causes a load current to be drawn through the primary winding 46 of saturable core transformer 45. This primary winding is inductively coupled through the secondary winding 47 to induce a secondary current therein having a magnitude dependent upon the magnitude of the load current which serves to charge the charging capacitor 49. The charging capacitor 49 is then charged positively until such time that secondary winding 47 reaches positive saturation, whereupon the charging capacitor 49 is connected directly across the silicon controlled rectifier. Upon this occasion the plate of charging capacitor 49 connected to secondary winding 47 is positive with respect to the plate thereof connected to anode 42 of silicon controlled rectifier 41. Accordingly, the capacitor 49 will apply a positive quenching potential to the cathode electrode of the rectifier 41 which serves to turn off the rectifier. Thereafter, the circuit will remain in its quiescent or off condition until it is again triggered on by a triggerng pulse appled thereto from the gating network formed by the resistor 52 and capacitor 53 in conjunction with the power supply connected across terminals 54. It can be appreciated that by varying the relative on-off periods of the silicon controlled rectifier by adjusting the time constants of the A.C. gating network 52, 53, and adjusting the saturation period of the saturable core transformer 45, the load current can be varied proportionally. The circuit therefore provides a relatively simple proportionally controlled power amplifier having a unique commutating network comprising a part thereof which is highly efficient, fast responding, and is small in size as well as comparatively inexpensive.

With respect to the circuit arrangement shown in FIGURE 4, as well as with further circuits described hereinafter, where the load is inductive in nature and where a booster rectifier such as 60 or 70 is connected across the load, the circuit will function as a current amplifier. This current amplification feature occurs by reason of the pulsating nature of the load current which charges the inductive load with the charge being discharged through the booster rectifier during the off periods of the silicon controlled rectifier. Thus the inductive load operates as a sort of fly-wheel to achieve current amplification with the circuit.

Figure 5:
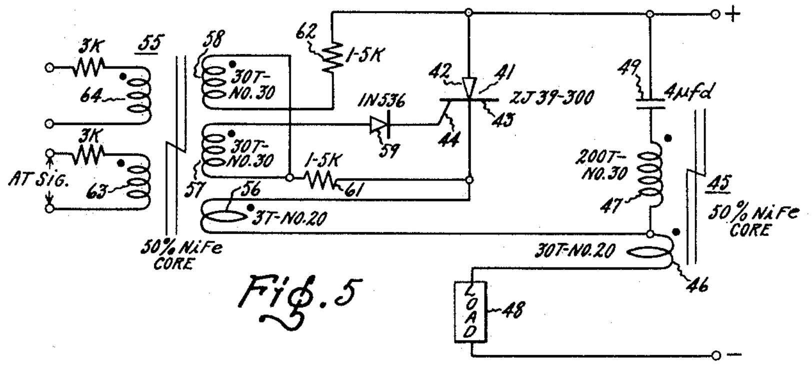
FIGURE 5 is a schematic circuit diagram of a second preferred form of a proportionally controlled power amplifier constructed in accordance with the invention which employs a new and improved gating circuit as a part thereof.

A second embodiment of a working proportionally controlled power amplifier constructed in accordance with the present invention is illustrated in FIGURE 5. The proportionally controlled amplifier shown in FIGURE 5 is formed by a silicon controlled rectifier having an anode electrode 42, cathode electrode 43, and a gating electrode 44. The silicon controlled rectifier 41 has a commutating network connected thereto for quenching or turning the rectifier off after it has been rendered conductive. This commutating network is similar in construction to the commutating network shown in the embodiment of the invention of FIGURE 4 of the drawings, and includes a charging capacitor 49 and a saturable core reactor 45 formed by a primary winding 46 and a secondary winding 47 inductively coupled to the primary winding 46. The primary winding 46 of the saturable core transformer 45 is connected through a suitable load circuit 48 to one terminal of the power source in a manner similar to the arrangement of FIGURE 4.

The circuit of FIGURE 5 differs from the FIGURE 4 arrangement, however, in the form of the gating circuit connected thereto. The gating circuit used in the circuit of FIGURE 5 employs a second saturable core transformer 55 which includes a primary winding 56 and a split secondary winding formed by two secondary winding halves 57 and 58. The primary winding 56 of the second saturable core transformer is connected to the juncture of the primary winding 46 and secondary winding 47 of the first saturable core transformer 45 and to the cathode electrode 43 of the silicon controlled rectifier. The secondary winding half 57 is connected through a diode rectifier 59 to the gating electrode 44 of the silicon controlled rectifier and through a first impedance formed by a resistor 61 to the cathode electrode 43 of the silicon controlled rectifier 41. The secondary winding half 58 is connected between the juncture of the first winding half 57 and the first impedance 61 through a second impedance formed by a resistor 62 to the positive terminal of the power supply source as well as to the anode of the silicon controlled rectifier 41. For control purposes, a control winding 63 is inductively coupled to both the primary and secondary winding halves of the second saturable core transformer 55, and is supplied from a source of suitable control signals. Additionally, a bias winding 64 is, likewise, inductively coupled to the second saturable core transformer 55, and is supplied from a direct current source of biasing potential for applying a desired bias to the second saturable core transformer 55. All of the components of the circuit shown in FIGURE 5 have the values shown in the drawings, and employ a commercially available standard silicon controlled rectifier.

In operation, the circuit arrangement of FIGURE 5 functions precisely the same as the circuit shown in FIGURE 4 of the drawings insofar as the commutation portion of its operation is concerned, and, hence, this operation will not be described again in detail. With respect to the gating circuit, however, the gating of the silicon controlled rectifier 41 to its on condition is achieved by saturating the secondary windings of the saturable core transformer 55 at a particular point in the cycle where it is desired that the silicon controlled rectifier be rendered conductive. This is achieved by appropriately proportioning the control signal supplied to the control winding 63, and properly proportioning the value of the D.C. bias supplied thereto by the D.C. bias winding 64. By tracing through the circuit formed by the first resistor 61, the secondary winding half 58, and the second resistor 62, it can be appreciated that it forms a voltage divider which is connected across the silicon controlled rectifier 41 and is connected through the secondary winding half 57 and diode rectifier 59 to the gating electrode 44 of the silicon controlled rectifier. By reason of this arrangement, leakage current drawn through the primary winding 56 of the second saturable core transformer 55, resistors 61 and 62, and the secondary winding half 58 will be incapable of firing the silicon controlled rectifier due to the high impedance of the second secondary winding half 57. However, upon this leakage current driving the saturable core transformer into a saturated condition, the impedance of the two secondary winding halves 57 and 58 will be reduced substantially to zero so that the effect is to connect the two resistors 61 and 62 directly across the silicon controlled rectifier with the juncture of the two resistors being directly connected to the gating electrode 44 through diode 59. This results in producing a sharp positive voltage pulse which is applied to the gating electrode and serves to render the silicon controlled rectifier 41 conductive.

Thereafter, the commutating network formed by the first saturable reactor 45 and the charging capacitor 49 functions to turn off the silicon controlled rectifier at a predetermined time depending upon the time required to drive the first saturable reactor 45 into saturation. The time relation between the turning on and the turning off of the silicon controlled rectifier 41 can, of course, be controlled by the value of the control signal supplied to the control winding 63. Accordingly, by controlling this control signal it is possible to proportionally control the output load current supplied through the load circuit 48. The advantages of the gating circuit illustrated in FIGURE 5 arrangement are that it provides an insulated control for the gating circuit of the silicon controlled rectifier, thereby allowing the proportionally controlled amplifier to be electrically insulated from its control source.

Figure 6:
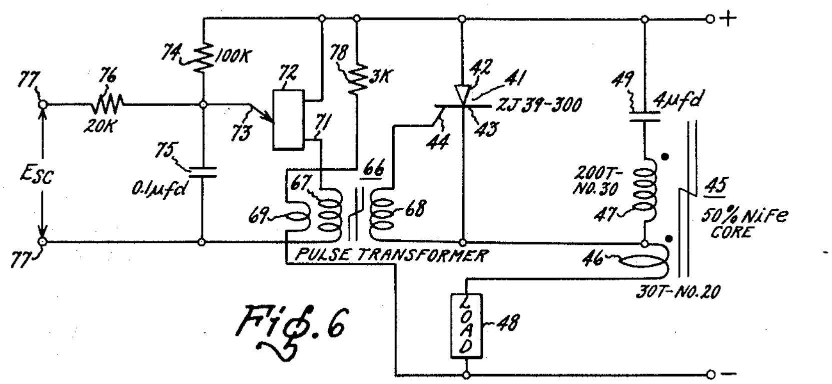
FIGURE 6 is a schematic circuit diagram of still another form of a proportionally controlled power amplifier constructed in accordance with the invention showing still another embodiment of novel gating circuit constructions comprising a part of a power amplifier.

Another embodiment of a proportionally controlled power amplifier circuit constructed in accordance with the invention is shown in FIGURE 6. The arrangement shown in FIGURE 6 includes a silicon controlled rectifier 41 having an anode electrode 42, a cathode electrode 43, and a gating electrode 44. The silicon controlled rectifier 41 shown in FIGURE 6 has a commutating circuit arrangement connected thereto which includes a saturable core transformer 45 having a primary winding 46 and a secondary winding 47 inductively coupled to the primary winding 46. The commutating circuit portion further includes a charging capacitor 49 connected in series circuit relationship with the secondary winding 47 of the saturable core transformer to the cathode electrode 43 of the silicon controlled rectifier 41. By this arrangement, the commutating circuit formed by the saturable core transformer 45 and charging capacitor 49 will develop a quenching potential across the capacitor 49 which will be applied to the silicon controlled rectifier 41 to render it nonconductive upon the saturable core transformer reaching a saturated condition. In order to gate on the silicon controlled rectifier 41, a gating circuit arrangement is provided which includes a second saturable core pulse transformer 66 having a primary winding 67 inductively coupled to a secondary winding 68 and to a control winding 69. The secondary winding 68 of the second saturable core transformer 66 is connected in series circuit relationship with the gating electrode 44 of the silicon controlled rectifier 41. The primary winding 67 of the second saturable core transformer is connected to a base electrode 71 of a unijunction transistor 72 of the type described on page 56 of the above identified "Transistor Manual," published by the General Electric Company. The remaining base electrode of the unijunction transistor 72 is connected directly to the positive terminal of the source of direct current potential. The emitter electrode 73 of the unijunction transistor is connected to the midpoint of a series connected resistor 74 and capacitor 75, which are connected across the direct current power supply source, and comprise an RC biasing network. The emitter electrode 73 is also connected through a voltage dropping resistor 76 to a source of gating control potential $E_{SC}$ connected to a pair of terminals marked 77. Additionally, the control winding 69 of the second saturable transformer 66 is connected in series with a voltage dropping resistor 78 across the direct current power supply source, and serves to provide a direct current bias to the second saturable core transformer 68.

In operation, the circuit shown in FIGURE 6 of the drawings functions identically to the FIGURE 4 and FIGURE 5 circuits insofar as the commutating portion of the circuit is concerned to render silicon controlled rectifier 41 non-conducting after it has been turned on by the gating circuit arrangement. The gating circuit arrangement operates through the unijunction transistor 72 to supply a positive gating pulse to the gating electrode 44 at desired timed intervals. This is accomplished by reason of the unijunction transistor which is connected in series with the primary winding 67 of the second saturable core transformer 66 across the direct current power supply source. In this arrangement, so long as the bias supplied to the emitter electrode 73 of the unijunction transistor 72 is below a predetermined value, the unijunction transistor will act as a voltage divider, and substantially no or little current will flow through the primary winding 67. However, when the signal input $E_{SC}$ supplied to the emitter electrode 73 of the unijunction transistor 72 goes above this predetermined value, the emitter will be forward biased, and emitter current will flow primarily to the base 71 thereby increasing current flow through the primary winding 67. This action results in driving the saturable core transformer into positive saturation, and produces a positive current pulse that is supplied to the gating electrode of silicon controlled rectifier 41. The point at which this occurs is of course determined by the values of the biasing network formed by the resistor 74 and the capacitor 75 as well as the biasing signal developed across bias winding 69 of the second saturable core transformer 66. Thereafter, the commutating network formed by the first saturable core transformer 45 and a charging capacitor 49 will operate in the previously described manner to turn off the silicon controlled rectifier 41 at predetermined intervals. Again by controlling the time relation between the time that the silicon controlled rectifier 41 is turned on by the gating network, and the time it is turned off by the commutating network, it is possible to proportionally control the power output through the load circuit 48.

In order to reset the unijunction transistor 72 so that it then functions as a volatge divider it is necessary to reduce the potential of the emitter electrode 73 below that of the base electrode so that the unijunction is no longer forward biased. This is done automatically upon the unijunction transistor breaking down and conducting to the base electrode 71 in that it serves to discharge the capacitor 75. Thereafter, unijunction transistor 72 will operate as a voltage divider until such time that capacitor 75 is again charged through resistor 74 to the potential where breakdown again occurs. The timing for this operation is of course determined by the time constant of the R-C circuit as well as the value of the gating signal $E_{SC}$ which may be varied as desired in order to obtain a desired output load current characteristic.

Figure 7:
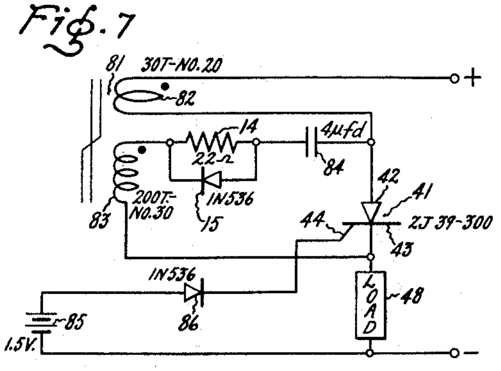
FIGURE 7 is a schematic circuit diagram of a free-running version of a proportionally controlled power amplifier constructed in accordance with the invention.

A free running oscillator version of a proportionally controlled power amplifier constructed in accordance with the invention is shown in FIGURE 7 of the drawings. In this arrangement a silicon controlled rectifier 41 is provided which has a cathode electrode 43, anode electrode 42 and a gating electrode 44. Connected to the silicon controlled rectifier is a saturable core transformer 81 having a primary winding 82 inductively coupled to a secondary winding 83. The secondary winding 83 has one of its terminals connected to the cathode electrode 43, and is connected through a charging capacitor 84 to the anode electrode of silicon controlled rectifier 41. Also connected in series circuit relationship with the secondary winding 83 and capacitor 84 is a smoothing resistor 14 having a diode rectifier 15 connected in parallel therewith. The silicon controlled rectifier 41 is connected in series circuit relationship with the primary winding 82 of the saturable core transformer 81 and a load circuit 48 across source of positive direct current potential. A gating signal is supplied to the gating electrode 44 of the silicon controlled rectifier 41 from a battery source of signal potentials 85 connected to the gating electrode 44 through an isolating diode rectifier 86.

By this arrangement, the battery source of control signals 85 will apply a continuing gating potential to the gating electrode 44 which causes the silicon controlled rectifier 41 to remain in its conductive condition except only at those times when a quenching potential is applied thereto from the charging capacitor 84 of the commutating network in the previously described manner. As discussed in connection with the simplified version of the commutating circuit shown in FIGURE 1 of the drawings, the smoothing resistor 14 and diode rectifier 15 serve to remove any tendency of the circuit to break into undesired oscillations as well as to smooth out the charging and discharging of the capacitor 84 thereby minimizing wear and tear on the circuit. To reiterate, after the current induced in the secondary winding 83 of the saturable core transformer 81 has driven the winding into positive saturation, and the charge on capacitor 84 has been allowed to leak off through the winding, the energy induced in the saturated winding 83 will cause the capacitor 84 to be charged negatively. Thereafter the negative charge in the capacitor 84 tends to again leak off through the saturated winding 83, and drives it toward negative saturation thereby resetting the circuit for another cycle of operation. Because the gating control potential is always present on the gating electrode of the silicon controlled rectifier, the silicon controlled rectifier will be turned on thereby again causing the secondary winding 83 to be driven towards positive saturation and repeating the cycle. Because of the presence of the smoothing resistor 14, and the diode 15, it is possible for the negative charge occurring on the capacitor 84 to be applied to the secondary winding 83 to drive it towards negative saturation and thereby resetting the core for the next cycle of operation. However, the presence of the resistor 14 and diode 15 at this point prevents the energy stored in the saturated core winding 83 to again be applied back to the charging capacitor 84 thereby causing the undesired oscillations. From an examination of this circuit it can be appreciated that the new and improved proportional power amplifier circuit can be embodied in many forms such as in a free running oscillator form, or in a control form such as shown in FIGURES 4–6 of the drawings wherein proportional control of the output load current is desired.

Figure 8:
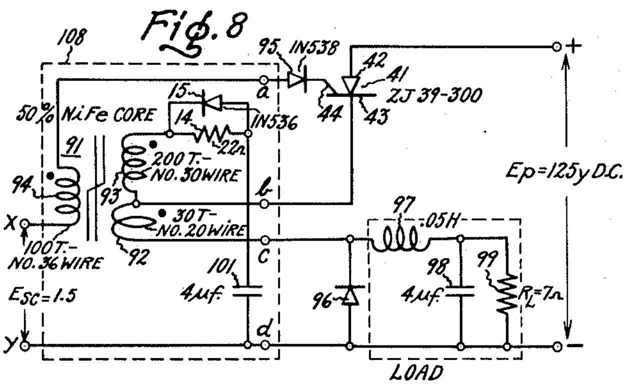
FIGURE 8 is a schematic circuit diagram of still another form of proportionally controlled power amplifier constructed in accordance with the invention.

Still another version of a proportionally controlled power amplifier constructed in accordance with the invention is shown in FIGURE 8 of the drawings. This circuit includes a silicon controlled rectifier 41 having a cathode electrode 43, anode electrode 42 and a gating electrode 44. A commutating circuit is connected to the silicon controlled rectifier 41, and is comprised by a saturable core transformer 91 having a primary winding 92 inductively coupled to a secondary winding 93 and to a control winding 94. A source of gating control signals $E_{SC}$ is connected through the control winding 94 and a diode rectifier 95 to the gating electrode 44 of the silicon controlled rectifier. The primary winding 92 is connected in the anode-cathode circuit of the silicon controlled rectifier and for this purpose one terminal of winding 92 is connected to the cathode electrode 43, and the remaining terminal thereof is connected to a load circuit formed by a diode rectifier 96, a choke coil 97, a capacitor 98 and load resistor 99. The load thus comprised exhibits generally capacitive characteristics, and comprises a part of the anode-cathode circuit of the silicon controlled rectifier 41. The secondary winding 93 of saturable core transformer 91 has one terminal connected to the cathode electrode 43 of the controlled rectifier, and has its remaining terminal connected to a smoothing resistor 14 and diode rectifier 15 in series circuit with a charging capacitor 101. The series circuit thus formed is connected between the cathode electrode 43 of the silicon controlled rectifier, and the negative or reference terminal of the power supply connected across the silicon controlled rectifier.

The circuit thus comprised functions in a manner similar to the previously described circuit embodiments in that a gating control signal applied across the terminals X, Y through the bias winding 94 to the gating electrode 44 will serve to gate the silicon controlled rectifier 43 on. Thereafter, load current drawn through the primary winding 92 of the saturable core transformer induces a charging current in the secondary winding 93 which will charge the charging capacitor 101 to a potential adequate to quench the silicon controlled rectifier, and render it nonconductive upon the saturable core transformer reaching positive saturation. During this cycle of operation the smoothing resistor 14 and diode 15 serve to prevent impulse charging of the charging capacitor 101, and to prevent undesired oscillations which would interfere or inhibit the turn off operation accomplished by means of the charging capacitor 101 and the saturable core transformer 91. The circuit arrangement of FIGURE 8 is somewhat more stable in its operation than the equivalent circuit arrangements of FIGURES 4 and 7 in that the charging capacitor 101 is connected back to the reference potential, and will not float with variations in the power supply value. Otherwise, the circuit is entirely similar to the FIGURE 4 and the FIGURE 7 circuit, and functions in precisely the same manner to develop a proportionally controlled output load current in the load circuit connected to the silicon controlled rectifier 41.

The magnetic silicon controlled saturable core transformer amplifier circuits shown in FIGURES 4, 7 and 8 of the drawings may be operated from an alternating current power source should it be desired. In the event that an alternating current power source is supplied to each of the circuits shown in FIGURES 4, 7 and 8 without further modification, half way power is obtained. The load current derived from the circuit when thus energized is controlled by the control voltage $E_{SC}$ applied to the gating electrodes of the silicon controlled rectifier during the positive half cycle of the A.C. power, and no output will be derived during the negative half cycle of the A.C. power supply. Since the chopper frequency commonly operates between two kilocycles and five kilocycles, and by chopper frequency is meant the frequency at which the silicon controlled rectifier is turned on and off, this frequency of operation is high when compared to the 60 cycle per second or 400 cycle per second alternating current supply, so that it can be appreciated that considerable control is available over the half cycle power derived by operating the circuits in this fashion.

Figure 9:
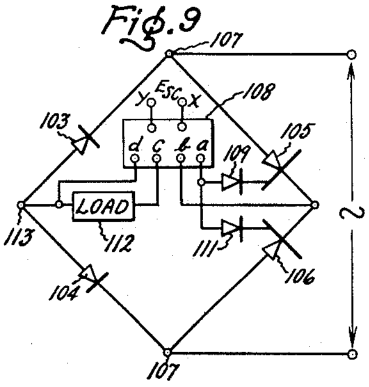
FIGURE 9 is a schematic circuit diagram of a full wave rectifier network employing silicon controlled rectifiers and the novel gating and commutating network shown in FIGURE 8 of the drawings in the dotted line box.

Should it be desired to obtain full wave power from an alternating current supply an arrangement such as is illustrated in FIGURE 9 of the drawings may be used. The full wave rectifier of FIGURE 9 comprises a rectifier bridge formed by a pair of diode rectifiers 103 and 104, and a pair of silicon controlled rectifiers 105 and 106 connected in back-to-back relationship in a closed Wheatstone bridge arrangement. The pair of diode rectifiers 103 and 104 comprise one pair of adjacent arms of the Wheatstone bridge, and the pair of silicon controlled rectifiers 105 and 106 comprise the remaining pair of adjacent arms. A source of alternating current energizing potential is connected across the two opposite terminals 107 of the bridge circuit formed by the junction of the two pairs of adjacent arms. A commutating circuit 108 is connected to the gating electrodes of each of the silicon controlled rectifiers 105 and 106. The commutating circuit 108 is identical to the commutating circuit portion of the proportionally controlled power amplifier shown in FIGURE 8 enclosed by the dotted lines. This portion of the circuit is identical in construction and operates in an identical manner to the commutating circuit portion contained in the dotted outline box 108 of the FIGURE 8 circuit arrangement, and hence will not be again described in further detail. From a consideration of the commutating circuit portion and the output terminals marked X, Y, *a*, *b*, *c* and *d*, it can be appreciated that an input control signal supplied to the input terminals X, Y in the FIGURE 9 circuit is applied through the terminal *a* across a pair of diode rectifiers 109 and 111 to the gating electrodes of the silicon controlled rectifiers 105 and 106, respectively. Further, the commutating circuit 108 includes a saturable core transformer formed by the primary windings 92 and 93 with the primary winding 92 being connected through the output terminal marked *c* to a load circuit 112 and through the output terminal marked *b* to the cathode electrodes of each of the silicon controlled rectifiers 105 and 106. Similarly, the secondary winding 93 of the saturable core transformer is connected through a smoothing circuit formed by a series connected resistor 14 and diode rectifier 15 in parallel through a series connected charging capacitor 101 out the output terminal marked *d* to the remaining terminal 113 of the bridge network. By this arrangement, full wave rectification will take place to each of the silicon controlled rectifiers 105 and 106 during alternate positive half cycles so that a full wave rectified load current is developed across the load circuit 112. Since the commutating circuit 108 is connected in common to both controlled rectifiers 105 and 106, the gating control signal applied across the input terminals X, Y of the commutating circuit will control alternately the firing of the silicon controlled rectifiers 105 and 106 depending upon which one has the positive half cycle applied thereto. In controlling the operation of the silicon controlled rectifiers 105 and 106 the gating and commutating network 108 functions in precisely the same manner as the circuit described with relation to FIGURE 8 of the drawings. The advantages of the circuit arrangement of FIGURE 9 are that it provides a full wave rectified load current to the load circuit 112.

Figure 11:
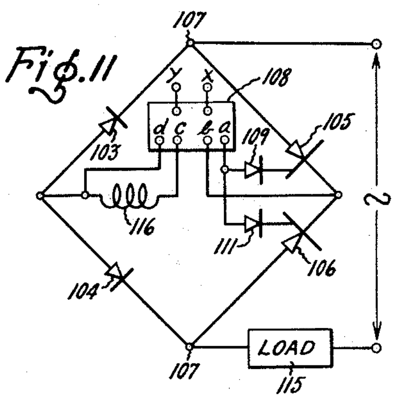
FIGURE 11 is a schematic circuit diagram of an alternating current rectifier bridge employing the novel gating and commutating network of FIGURE 8 illustrated in the dotted box.

The circuit arrangement shown in FIGURE 11 of the drawings is identical in all respects to the full wave rectifier bridge network of FIGURE 9, with the exception of the position of the load circuit shown at 115, and the inclusion of a choke coil 116 inserted in the anode-cathode circuits of the silicon controlled rectifiers 105 and 106 in place of the D.C. load circuit 112 in the circuit arrangement of FIGURE 9. This alteration allows the circuit to operate as an alternating current bridge circuit with an alternating current load, and achieves proportional control of the load current supplied through the load circuit in a manner identical to that with respect to the FIGURE 9 circuit arrangement. In all other respects, the FIGURE 11 circuit arrangement is identical in construction and operation to the full wave rectifier bridge network of FIGURE 9.

Figure 10:
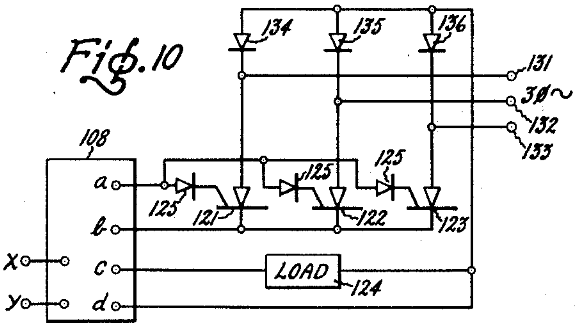
FIGURE 10 is a schematic circuit diagram of a three-phase rectifier network constructed in accordance with the invention, which also employs the gating and commutating network of FIGURE 8 shown in the dotted box.

A three phase alternating current proportionally controlled power amplifier employing the principles of the present invention is illustrated in FIGURE 10 of the drawings. In FIGURE 10 of the drawings three silicon controlled rectifiers 121, 122 and 123 are provided. The cathode electrodes of the silicon controlled rectifiers 121, 122 and 123 are connected in common to a commutating network 108 which is identical in construction and operation to the commutating and gating network shown in the enclosed dotted box 108 of FIGURE 8. By relating the output terminals *a, b, c,* and *d* of the gating and commutating circuit arrangement 108 of FIGURE 8 to the similarly marked terminal points in the box 108, it can be appreciated that the cathode electrodes of all of the silicon controlled rectifiers 121, 122 and 123 are connected through the primary winding 102 of the saturable core transformer 91 to a common load 124 in the anode-cathode circuits of all of the silicon controlled rectifiers. The secondary winding 93 of the saturable core transformer is then connected between a juncture point of the cathode electrodes of all of the silicon controlled rectifiers and the primary winding of the saturable core transformer through a series connected smoothing resistor 14 and parallel connected diode 15 to a charging capacitor 101 connected to the output terminal marked *b*. Input gating control signals are applied to the input terminals marked *x, y* and through the output terminal *a* and diode rectifiers 125 to the gating electrodes of all of the silicon controlled rectifiers 121, 122 and 123 in parallel. A three phase alternating current supply is connected across the silicon controlled rectifiers with one phase terminal 131 being connected to the anode electrode of the silicon controlled rectifier 121, a second phase terminal 132 being connected to a second silicon controlled rectifier 122, and a third phase input terminal 133 being connected to the anode electrode of the silicon controlled rectifier 123. The anode electrodes of all the silicon controlled rectifiers 121, 122 and 123 are also connected through respective isolating diode rectifiers 134, 135 and 136 back through the load circuit 124. In operation, the circuit of FIGURE 10 functions in a similar fashion to the gating and commutating circuit arrangement shown in FIGURE 8. The FIGURE 10 circuit differs in the manner of energization of the circuit by the three phase power supply connected across the input terminals 131–133. From an examination of this circuit it can be appreciated that conduction through the respective silicon controlled rectifiers 121, 122 and 123 will occur only during the positive half cycles of the three phase alternating current supplied thereto. Accordingly, at a given time, at least two of the silicon controlled rectifiers will be conducting, and the periods of conduction of all three rectifiers will overlap to achieve a little better voltage stability in the output load circuit using an alternating current supply.

Figure 12:
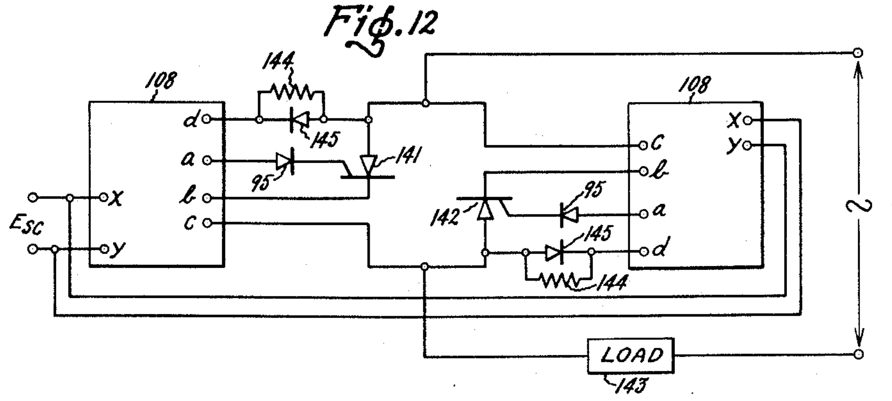
FIGURE 12 is a circuit diagram of a second form of full-wave alternating current rectifier bridge network employing silicon controlled rectifiers.

A second form of an alternating current full wave bridge rectifier network incorporating the principles of the present invention is illustrated in FIGURE 12. In this embodiment of the invention, a pair of silicon controlled rectifiers 141 and 142 are provided. The silicon controlled rectifiers 141 and 142 are connected in back-to-back relationship across a source of single phase alternating current supply in series with an alternating current load circuit 143. The silicon controlled rectifier 141 is connected in series circuit relationship with a gating and commutating circuit 108 identical in construction to the gating and commutating circuit illustrated in detail in FIGURE 8 of the drawings. Accordingly, the cathode electrode of the silicon controlled rectifier 141 is connected in series with the primary winding 92 of the saturable core transformer 91, and the secondary winding 93 of the saturable core transformer is connected in series circuit relationship with a smoothing circuit formed by a parallel connected resistor 14 and diode rectifier 15, and with a series connected charging capacitor 101. This series circuit is connected across the diode 14 through the terminals *b* and *d*, and includes an additional isolating network formed by a parallel connected resistor 144 and diode rectifier 145. Gating signals $E_{SC}$ are supplied to the gating electrode of the silicon controlled rectifier 141 from an output terminal *a*. The silicon controlled rectifier 142 has an identical gating and commutating circuit arrangement 108 connected thereto so that each silicon controlled rectifier has a separate gating and commutating circuit controlling its operation. A source of gating control signals $E_{SC}$ is connected in common to the gating signal input terminals *x, y* of both commutating circuits 108 so that the gating and commutating circuits 108 are operated in tandem by a single source of gating control signals. In operation, the circuit arrangement of FIGURE 12 functions in a manner similar to the arrangement of FIGURE 11 in that each of the silicon controlled rectifiers 141 and 142 will be operated sequentially during the positive half cycles of the alternating current voltage supplied thereto to develop a proportionally controlled alternating load current across the alternating current load 143. About the only difference in the circuits is the provision of the additional gating and commutating circuit arrangement 108 which provides for separate control over the firing of each of the silicon controlled rectifiers 141 and 142.

From the foregoing description it can be appreciated that the invention provides new and improved proportionally controlled power amplifier circuits which have relatively high gain, a fast response and are highly efficient in operation. In making available these new and improved proportionally controlled amplifier circuits a novel commutating network for use in conjunction with silicon controlled rectifiers has been provided which serves to turn off the silicon controlled rectifier after it has been rendered conductive. Additionally, the invention makes available new and improved gating circuit arrangements for use with silicon controlled rectifiers to control the point at which the rectifiers are rendered conductive by applied heating control signals.

Having described several embodiments of the new and improved proportionally controlled power amplifiers constructed in accordance with the invention, it is believed obvious that other modifications and variations of the invention are possible in the light of the above teachings. It is therefore to be understood that changes may be made in the particular embodiments of the invention described which are within the full intended scope of the invention as defined by the appended claims.

What I claim as new and desire to secure by Letters Patent of the United States is:

1. A grid controlled unidirectional conducting device of the type having a cathode, anode and gating electrode wherein conduction through the device is initiated by the gating electrode but thereafter the gating electrode loses control over conduction through the device, means for applying a gating control signal to the gating electrode of said unidirectional conducting device to render it conductive, a saturable reactor operatively coupled to said unidirectional conducting device, and a charging device connected in circuit relationship with said saturable reactor and through an essentially zero impedance path to said unidirectional conducting device for applying a quenching potential to said unidirectional conducting device upon said saturable reactor reaching a saturated condition to thereby terminate conduction through said unidirectional conducting device.

2. The combination set forth in claim 1 further characterized by a smoothing circuit operatively coupled to said charging device for limiting the peak charging current through the charging device and preventing undesired oscillations from building up during switching of said unidirectional conducting device to its on and off condition.

3. The combination set forth in claim 1 further characterized by a smoothing circuit comprising a parallel connected resistor and diode rectifier connected in series circuit relationship with said charging device and said saturable reactor for limiting the peak charging current through the charging device and preventing undesired oscillations from building up during switching of said unidirectional conducting device to its on and off condition.

4. A control amplifier including in combination a gate controlled unidirectional conducting device having a cathode, plate, and gating electrodes wherein conduction through the device is initiated by the gating electrode which thereafter loses control over conduction through the device and the relative anode-cathode potential of the device must be reduced to cut off conduction through the device, a saturable core transformer having a primary winding connected in the anode-cathode circuit of said unidirectional conducting device and having a secondary winding inductively coupled to said primary winding, a charging capacitor connected in series circuit relationship with said secondary winding across said unidirectional conducting device for aplying a quenching potential which varies in magnitude with the magnitude of the load current to said unidirectional conducting device upon said saturable reactor reaching a saturated condition, and means for applying a gating control signal to the gate electrode of said unidirectional conducting device.

5. A control amplifier including in combination a silicon controlled rectifier having an anode, a cathode and gating electrode, a load circuit operatively coupled in the anode-cathode circuit of said silicon controlled rectifier, a saturable core transformer having its primary winding operatively coupled in the anode-cathode circuit of said silicon controlled rectifier, the secondary winding of said saturable core transformer being also coupled in the anode-cathode circuit of said silicon controlled rectifier, a charging capacitor connected in series circuit relationship with the secondary winding of said saturable reactor transformer for applying a quenching potential which varies in magnitude with the magnitude of the load current to said silicon controlled rectifier upon said saturable core transformer reaching a saturated condition, and means for applying a gating control signal to the control electrode of said silicon controlled rectifier.

6. A grid controlled unidirectional conducting device of the type having a cathode, anode and gating electrodes wherein conduction through the device is initiated by the gating electrode which thereafter loses control over conduction through the device and the relative anode-cathode potential of the device must be reduced to cut off conduction through the device, means for applying a gating control signal to the gating electrode of said unidirectional conducting device, a saturable core transformer having a primary winding and a secondary winding inductively coupled to the primary winding, said primary winding being connected between said unidirectional conducting device and a source of reference potential, and a charging capacitor connected in series circuit relationship with said secondary winding and to said unidirectional conducting device for applying a quenching potential which varies in magnitude with the magnitude of the load current to said unidirectional conducting device upon said saturable core transformer reaching a saturated condition.

7. The combination set forth in claim 6 further characterized by a smoothing resistor connected in series circuit relationship with said charging capacitor and said secondary winding and a diode rectifier connected in parallel circuit relationship with said smoothing resistor.

8. A grid controlled unidirectional conducting device of the type having a cathode, anode and gating electrodes wherein conduction through the device is initiated by the gating electrode which thereafter loses control over conduction through the device and the relative anode-cathode potential of the device must be reduced to cut off conduction through the device, a gating circuit operatively coupled to the gating electrode of said unidirection conducting device, said gating circuit comprising a first saturable core transformer having a primary winding and a split secondary winding inductively coupled to the primary winding, said primary winding being connected in the anode-cathode circuit of said unidirectional conducting device, and a pair of impedances connected in series circuit relationship through one winding half of said split secondary windings across said unidirection conducting device the remaining half of the split secondary winding being connected to the gating electrode of said unidirectional conducting device and to the junction of said first mentioned winding half and one of the impedances, a control winding inductively coupled to said saturable core transformer for controlling the saturation period thereof, a second saturable core transformer having a primary winding and a secondary winding inductively coupled to the primary winding, said primary winding being connected in the anode-cathode circuit of said unidirectional conducting device, and a charging capacitor connected in circuit relationship with said secondary winding and said unidirectional conducting device for applying a quenching potential to said device upon the second saturable transformer reaching a saturated condition to thereby terminate conduction through the unidirectional conducting device.

9. A grid controlled unidirectional conducting device of the type having a cathode, anode and gating electrodes wherein conduction through the device is initiated by the gating electrode which thereafter loses control over conduction through the device and the relative anode-cathode potential of the device must be reduced to cut off conduction through the device, a gating circuit operatively coupled to the gating electrode of said unidirectional conducting device, said gating circuit comprising a saturable core transformer having a primary winding and a split secondary winding inductively coupled to the primary winding, said primary winding being connected in the anode-cathode circuit of said unidirectional conducting device, and a pair of impedances connected in series circuit relationship through one winding half of said split secondary windings across said unidirectional conducting device the remaining half of the split secondary winding being connected to the gating electrode of said unidirectional conducting device and to the junction of said first mentioned winding half and one of the impedances, and a control winding inductively coupled to said saturable core transformer for controlling the saturation period thereof.

10. A grid controlled unidirectional conducting device of the type having a cathode, anode and gating electrodes wherein conduction through the device is initiated by the gating electrode which thereafter loses control over conduction through the device and the relative anode-cathode potential of the device must be reduced to cut off conduction through the device, a gating circuit operatively coupled to the gating electrode of said unidirectional conducting device, said gating circuit comprising a first saturable core transformer having a primary winding and a secondary winding inductively coupled to the primary winding, said secondary winding being connected in series circuit relationship with the gating electrode of said unidirectional conducting device, a unijunction transistor having one base electrode connected to the primary winding of said saturable core reactor and the remaining base electrode connected to a source of positive potential, a control signal developing circuit connected to the emitter electrode of said unijunction transistor, a control winding inductively coupled to said saturable core transformer for controlling the saturation period thereof, a second saturable core transformer having a primary winding and a secondary winding inductively coupled to the primary winding, said primary winding being connected in the anode-cathode circuit of said unidirectional conducting device, and a charging capacitor connected in circuit relationship with said secondary winding and said unidirectional conducting device for applying a quenching potential to said device upon the saturable reactor reaching a saturated condition to thereby terminate conduction through the unidirectional conducting device.

11. A grid controlled unidirectional conducting device of the type having a cathode, anode and gating electrodes wherein conduction through the device is initiated by the gating electrode which thereafter loses control over conduction through the device and the relative anode-cathode potential of the device must be reduced to cut off conduction through the device, a gating circuit operatively coupled to the gating electrode of said unidirectional conducting device, said gating circuit comprising a saturable core reactor pulse transformer having a primary winding and a secondary winding inductively coupled to the primary winding, said secondary winding being connected in series circuit relationship with the gating electrode of said unidirectional conducting device, a unijunction transistor having one base electrode connected to the primary winding of said saturable core reactor and the remaining base electrode connected to a source of positive potential, a control signal developing circuit connected to the emitter electrode of said unijunction transistor, and a control winding inductively coupled to said saturable reactor transformer for controlling the saturation period thereof.

12. The combination set forth in claim 11 further characterized by a smoothing resistor connected in series circuit relationship with said charging capacitor and said secondary winding and a diode rectifier connected in parallel circuit relationship with said smoothing resistor.

13. A rectifier bridge formed by a pair of diode rectifiers and a pair of silicon controlled rectifiers connected in a closed Wheatstone bridge arrangement with the diode rectifiers forming one pair of adjacent arms and the silicon controlled rectifiers connected in back to back relation forming the remaining pair of adjacent arms, a source of alternating current connected across the opposite terminals of the bridge circuit formed by the junction of the two pairs of arms, a commutating circuit including a saturable core transformer having a primary winding and a secondary winding inductively coupled to the primary winding, said primary winding being connected between the remaining two terminals of the bridge to the cathode electrodes of said silicon controlled rectifiers and said secondary winding being connected in series circuit relationship with a charging capacitor to said unidirectional conducting devices for applying a quenching potential to said devices upon said saturable core transformer reaching a saturated condition to thereby terminate conduction through the devices, means for applying a gating control signal to the gating electrodes of said unidirectional conducting devices, and a load circuit connected in series circuit relationship with said primary winding.

14. The combination set forth in claim 13 wherein said load circuit is connected intermediate said bridge and said source of alternating current and an inductive coil is connected in series circuit relationship with the primary winding of said saturable core reactor.

15. A three phase rectifier including in combination three silicon controlled rectifiers each having a plate, cathode, and gating electrode, a commutating circuit including a saturable core transformer having a primary winding and a secondary winding inductively coupled to said primary winding, said primary winding being connected in common in the anode-cathode circuits of all said silicon controlled rectifiers, a source of three phase alternating current supply voltage having three single phase supply conductors with each one of said conductors being connected to a respective one of said silicon controlled rectifiers, the secondary winding of said saturable core transformer being connected in series circuit relationship with a charging capacitor and to each of said silicon controlled rectifiers in parallel circuit relationship for applying a quenching potential to said rectifiers upon said saturable core transformer reaching a saturated condition to thereby terminate conduction through the rectifiers, and means for applying a gating control signal to the gating electrodes of all said silicon controlled rectifiers.

16. A rectifier network including in combination a pair of silicon controlled rectifiers having anode, cathode and gating electrodes connected in back to back relation across a source of alternating current voltage, a respective commutating circuit coupled to each of said silicon controlled rectifiers, each of said commutating circuits comprising a saturable core transformer having a primary winding and a secondary winding inductively coupled to said primary winding, said primary winding being connected in the cathode-anode circuit of its respective silicon controlled rectifier, and the secondary winding of each of said saturable core transformers being connected in series circuit relationship with a charging capacitor and to its respective silicon controlled rectifier for applying a quenching potential to the rectifier to thereby terminate conduction through it, means for applying a gating control signal to the gating electrodes of both said silicon controlled rectifiers, and a load circuit connected intermediate said silicon controlled rectifiers and said source of alternating current voltage.

17. A control amplifier including in combination a silicon controlled rectifier having an anode, a cathode and gating electrode, an inductive load circuit operatively coupled in the anode-cathode circuit of said silicon controlled rectifier, a saturable core transformer having its primary winding operatively coupled in the anode-cathode circuit of said silicon controlled rectifier, the secondary winding of said saturable core transformer being also coupled in the anode-cathode circuit of said silicon controlled rectifier, a charging capacitor connected in series circuit relationship with the secondary winding of said saturable reactor transformer, means for applying a gating control signal to the control electrode of said silicon controlled rectifier, and a booster rectifier connected across said inductive load circuit.

18. A grid controlled unidirectional conducting device of the type having a cathode, anode and gating electrodes, a gating circuit operatively coupled to the gating electrode of said unidirectional conducting device, said gating circuit comprising a saturable reactor having at least a control winding and a secondary winding, a pair of impedances operatively connected in series circuit relationship across a source of potential, with the secondary winding of said saturable reactor being connected between the juncture of said impedances and the control gate of said unidirectional conducting device, and means for applying a gating control signal to the control winding of said saturable reactor.

19. The combination set forth in claim 1 wherein the grid controlled undirectional conducting device is a silicon controlled rectifier.

References Cited in the file of this patent

UNITED STATES PATENTS 2,773,184 Rolf ------------------ Dec. 4, 1956